United States Patent [19]

Olsen et al.

[11] Patent Number: 5,627,521

[45] Date of Patent: May 6, 1997

[54] PERSONAL MICROWAVE AND RADIO FREQUENCY DETECTOR

[75] Inventors: Richard G. Olsen; John R. Forstall, both of Pensacola, Fla.

[73] Assignee: The United States of America as represented by the Secretary of the Navy, Washington, D.C.

[21] Appl. No.: 208,248

[22] Filed: Mar. 9, 1994

[51] Int. Cl.$^6$ .................................................. G08B 17/12
[52] U.S. Cl. .......................... 340/600; 340/539; 324/95; 324/96; 381/68; 381/68.6; 381/69
[58] Field of Search ...................... 340/600, 539; 324/95, 96; 250/250; 381/68, 68.6, 69; 342/896; 343/894

[56] References Cited

U.S. PATENT DOCUMENTS

| | | | |
|---|---|---|---|
| 4,644,330 | 2/1987 | Dawling | 340/575 |
| 5,185,802 | 2/1993 | Stanton | 381/68.6 |
| 5,295,191 | 3/1994 | Van Vroenhoven | 381/68.6 |

FOREIGN PATENT DOCUMENTS

| | | | |
|---|---|---|---|
| 0549550 | 6/1993 | United Kingdom | 340/600 |

OTHER PUBLICATIONS

Electronics Engineers' Handbook, Donald G. Fink & Donald Christiansen, 3rd Edition, Electromagnetic Spectrum (pp. 42–43).

Primary Examiner—Jeffery Hofsass
Assistant Examiner—Julie B. Lieu
Attorney, Agent, or Firm—A. D. Spevack; William Garvert; John Wynn

[57] ABSTRACT

A self-contained personal microwave and RF detector, which includes, inter alia, the housing and associated electronics of a standard hearing aid, is configured to produce an audible indication to a wearer thereof in response to electromagnetic fields of dangerously high levels within predetermined frequency ranges.

8 Claims, 1 Drawing Sheet

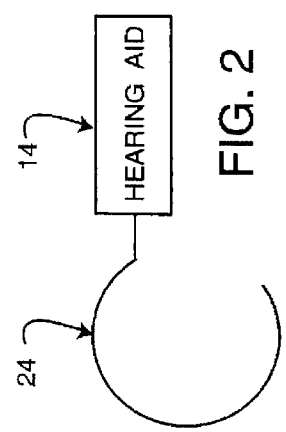
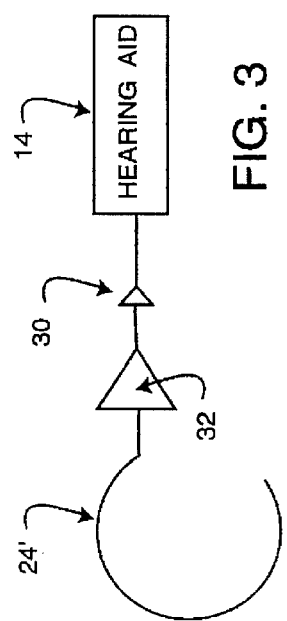
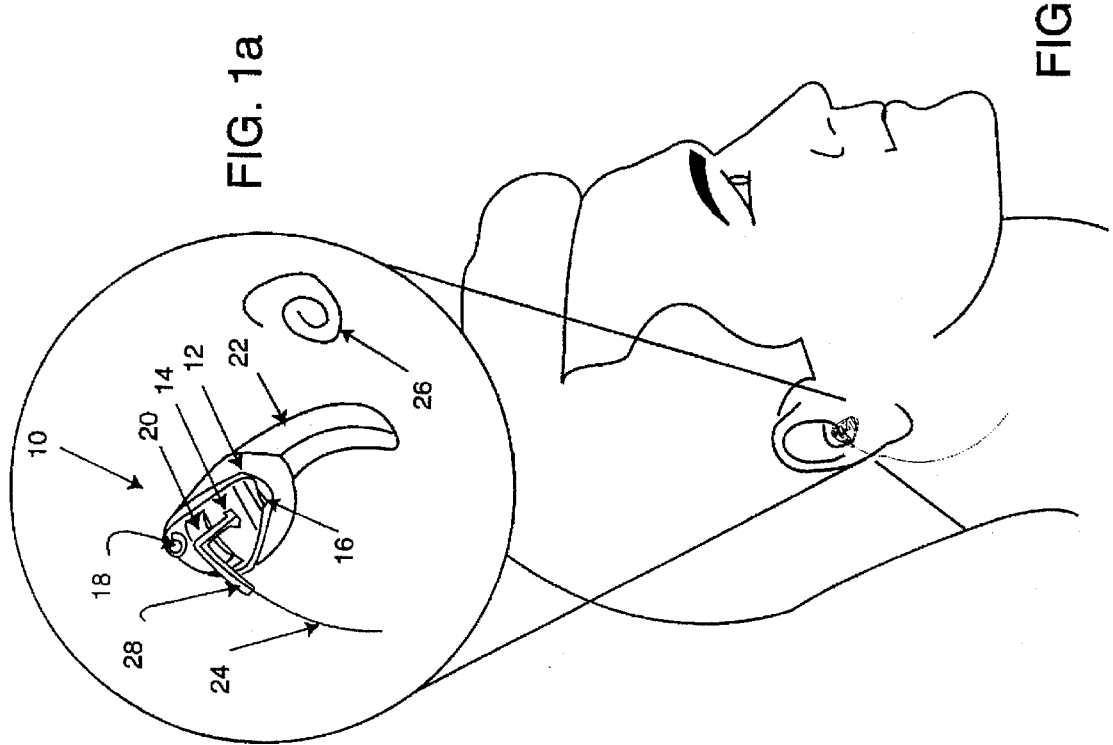

PERSONAL MICROWAVE AND RADIO FREQUENCY DETECTOR

BACKGROUND OF THE INVENTION

1. Field of the Invention

The present invention relates to a personal microwave and radio frequency (RF) detector. More particularly, the present invention relates to a self-contained personal microwave and RF detector which can be worn in a user's ear and provides an instantaneous audible warning of dangerously high electromagnetic fields.

2. Description of the Prior Art

Electromagnetic radiation hazards to personnel are presently detected by survey of an area with handcarried instruments, or instruments which are fastened to a user's clothing, to detect whether electromagnetic radiation in the area exceeds permissible exposure limits. For example, U.S. Pat. No. 5,168,265 to Aslan discloses a personal electromagnetic radiation monitor worn by a user who may be exposed to potentially harmful levels of electromagnetic energy in the 2–18 GHz frequency range. The Aslan monitor has a two piece housing with a resilient clip mounted on a back wall of the housing for allowing a user to carry the monitor on a belt or shirt pocket. A pair of mutually orthogonally disposed antenna elements receive electromagnetic energy for detection.

When detected electromagnetic energy is above a preset threshold, the Aslan monitor actuates a periodic audible warning tone with an increasing repetitive rate as the level of exposure increases. The Aslan monitor also includes an ear plug assembly allowing the monitor to be used in high noise environments. A hollow tube, having a pneumatic ear plug mounted on one, is coupled to the monitor housing. A warning tone produced by the monitor is transmitted to a user's ear through the tube of the ear assembly.

U.S. Pat. No. 4,539,567 to Brewer discloses another small personal microwave monitor device attached to the clothing of a user and adapted for use from 2–15 GHz. The Brewer monitor provides field alarms, field monitors, accumulated dose alarms and integrated dose monitoring of microwave radiation. Brewer discloses a variety of antenna configurations for permitting use at other frequencies, for example, between 0.9–2 GHz as well as 15–30 GHz.

U.S. Pat. No. 4,301,406 to Shriner discloses a microwave detector conveniently carried or worn by a user. One embodiment of the Shriner detector includes a very low-wattage gaseous-discharge lamp having electrodes connected to the ends of a pair of antenna wires. A second embodiment of the Shriner detector shaped like a fountain-pen. Yet another embodiment shaped like a bracelet or finger ring.

U.S. Pat. No. 4,032,910 to Hollway et al. discloses a portable detector for producing an alarm when placed in a microwave field having a power density greater than a predetermined limit. One embodiment of the Hollway detector includes a dipole antenna connected to filament leads of an incandescent lamp mounted on a card which can be pinned to the lapel of a user. An alarm is signalled by a glow from the lamp filament.

While these and other known microwave radiation detectors provide an indication of detection of a microwave field, there is still a need for a microwave and radio frequency (RF) detector which provides an instantaneous acoustical warning of dangerously high electromagnetic fields, permitting workers to perform their normal tasks while wearing protective equipment such as helmets, goggles, ear muffs, etc. Further, there is a need for a simple, compact, self-contained microwave and RF detector having long battery life and operates over an extremely broad band of frequencies, for example, 2 MHz to 22 GHz. Additionally, there is a need for providing a user with immediate knowledge of the presence of radar or RF transmitting devices operating in the vicinity of the user. Existing radar detection devices are comparatively large, externally worn, that is, worn on the user's clothing, and limited to operation at microwave frequencies.

SUMMARY OF THE INVENTION

The present invention provides these and other advantages by providing a self-contained electromagnetic radiation detector apparatus including an antenna for producing a received electromagnetic radiation signal and a detector, coupled to the antenna, for producing an audible indication in response to the received electromagnetic radiation signal, wherein the detector fits into an ear canal of a user. Preferably, the detector includes a body and an amplifier portion of a hearing aid. The audible indication produced by the detector is related to a modulation of the received electromagnetic radiation signal, and when the received electromagnetic radiation signal is a continuous wave, the audible indication is an audible quieting produced by the detector.

According to one aspect of the present invention, the radiation detector apparatus includes a detector diode, having a first terminal coupled to the antenna and a second terminal coupled to the detector, for detecting and providing the received electromagnetic radiation signal to the detector. According to another aspect, the radiation detector apparatus further includes an amplifier having an input coupled to the antenna and an output coupled to the first terminal of the detector diode, for amplifying the received electromagnetic radiation signal.

Other features of the present invention are that the detector apparatus includes a volume control for controlling a volume of an audible indication and an acoustical cavity for storing the antenna, and that the antenna includes a strain relief.

The present invention also provides a self-contained electromagnetic radiation detector including a body having an ear canal shell for fitting into an ear canal of a user, an antenna for producing a received electromagnetic radiation signal, and an amplifier, disposed within the body and coupled to the antenna, for producing an audible indication in response to the received electromagnetic signal. Preferably, the ear canal shell is detachable. A detector diode, having a first terminal coupled to the antenna and a second terminal coupled to the amplifier, can be included for detecting and providing the received electromagnetic radiation signal to the detector. Further, an amplifier, having an input coupled to the antenna and an output coupled to the first terminal of the detector diode, can be used for amplifying the received electromagnetic radiation signal.

BRIEF DESCRIPTION OF THE DRAWINGS

The invention can be more fully understood from the following detailed description of the invention when considered in conjunction with the accompanying Figures which form a part of this application, in which the same components are indicated with the same reference numerals, and in which:

FIG. 1 shows a perspective view of a personal microwave and RF detector according to the present invention;

FIG. 2 shows a schematic block diagram of a first embodiment of the present invention; and FIG. 3 shows a schematic block diagram of a second embodiment of the present invention.

DESCRIPTION OF THE PREFERRED EMBODIMENTS

Referring to FIG. 1, the present invention is a self-contained personal microwave and radio frequency (RF) detector 10 for providing a user with an instantaneous audible warning when modulated electromagnetic fields of dangerously high levels in the frequency range of 2 MHz–22 GHz are detected. The detector 10, worn in the ear canal, allows a user to perform normal duties while being warned of high levels of beamed, reflected or reradiated energy that might unintentionally occur in a workplace. A first embodiment schematically shown in FIG. 2 provides detection of microwave and RF signals covering a frequency range of about 2 MHz to about 3 GHz. A second embodiment schematically shown in FIG. 3 provides detection of microwave and RF signals covering a range of about 3 GHz to 22 GHz. Additionally, the present invention has applications where a user requires immediate knowledge of the presence of radar or RF transmitting devices operating in the vicinity.

When radiation is detected by the present invention, an audible tone is produced which is related to the modulation of the detected radiation. That is, the audible tone is related to, for example, a pulse repetition interval (PRI) of a microwave signal. The shorter the PRI of the detected signal, the higher the frequency of the tone produced. Presence of a continuous wave (CW) signal can also be detected and distinguished from a modulated signal by an audible quieting in the output of the detector. In one embodiment of the present invention, sensitivity of the detector circuitry is increased allowing detection of relatively weak fields for determining, for example, presence of radar signals at great distances.

Referring again to FIG. 1, the self-contained personal microwave and RF detector 10 uses a housing 12 and associated electronics (not shown) of a standard hearing aid 14, such as a Bausch and Lomb hearing aid model "Sound Choice" for example. For purposes of the present invention, the associated electronics (not shown) comprises a microphone having its input operatively attached to and within an acoustic cavity 16 of the housing 12. The output terminal of the microphone (not shown) is operatively connected between a volume control 18, which is operatively attached to the housing 12, and the input terminal of an amplifier (not shown). The output of the amplifier is operatively connected to a transducer (not shown) but also operatively attached to and within the acoustic cavity 16 of the housing 12. A battery (not shown) for powering the amplifier is operatively connected thereto and is operatively attached to a battery compartment door 20 of the housing 12. The housing 12 of the hearing aid 14 further includes a detachable ear-canal shell 22 which is preferably supplied in a plurality of sizes for fitting the ear canals of different users. The battery (not shown) is changed by opening the battery compartment door 20. The battery compartment door 20 and the battery (not shown) serve as an on/off switch by permitting the insertion and/or removal of the battery. The volume of sound from the transducer (not shown) of the associated electronics (not shown) is controlled, inter alia, by volume control 18. In use, the self-contained personal microwave and RF detector 10 is fitted into a user's ear canal, as shown in FIG. 1.

In the first embodiment of FIG. 2, the output terminal of the microphone (not shown) of the associated electronics (not shown) of hearing aid 14 is disconnected from the input terminal of the amplifier (not shown) of the associated electronics (not shown) and replaced with a short length of insulated copper wire 24. The insulated copper wire 24 serves as an antenna for receiving hazardous level microwave and RF signals. The insulated wire 24 is rolled-up (at 7) in acoustical cavity 16 when the self-contained personal microwave and RF detector 10 is not in use. The length and size of the insulated copper wire 24 can vary depending on specific applications. For example, a 5 cm length piece of #30 AWG insulated copper wire or a 4 inch length of #33 AWG insulated copper wire can be used. The insulated copper wire 24 passes through plastic sleeve 4 which provides strain relief. Plastic sleeve 28 is preferably 2 cm in length. In operation, the insulated copper wire 24 can be bent for optimum orientation, depending upon the particular application, for receiving electromagnetic radiation.

In the second embodiment of FIG. 3, the microphone (not shown) of the associated electronics (not shown) of hearing aid 14 is removed and replaced by a zero-bias Schottky detector diode 30, such as an HSCH-3486, for example. The output terminal of the detector diode 30 is coupled to the input terminal of the amplifier (not shown) of the associated electronics (not shown) of the hearing aid 14. In this embodiment, an insulated copper wire 24', i.e., a 7 cm length of #30 AWG copper wire, serves as an antenna and is connected to the input terminal of a miniature microwave amplifier 32, which, in turn, has its output terminal connected to the input terminal of the detector diode 30, aforementioned. The miniature microwave amplifier 32 is powered by the battery (not shown). The insulated copper wire 24' also passes through plastic sleeve 28 (see FIG. 1) for strain relief. Miniature microwave amplifier 32, detector diode 30 and the insulated copper wire 24' allow detection of relatively weak fields for determining the presence of radar or other modulated RF signals at great distances.

Those skilled in the art, having the benefits of the teachings of the invention as described herein, can effect numerous modifications therein. These modifications are to be construed as being encompassed by the appended claims.

We claim:

1. In a standard hearing aid configured to normally convert input sound waves into electrical signals and, in turn, into amplified electrical signals within the audio frequency range, the standard hearing aid including a housing, a detachable ear-canal shell operatively attached to the housing, a microphone operatively attached to the housing and the detachable ear-canal shell for converting the input sound waves into the electrical signals within the audio frequency range at an output terminal of the microphone, an amplifier having an input terminal operatively connected to the output terminal of the microphone for increasing the level of the electrical signals within the audio frequency range at the output terminal of the microphone so as to produce at an output terminal of the amplifier amplified electrical signals within the audio frequency range, a battery operatively connected to the amplifier for supplying power thereto, a volume control operatively connected to the amplifier for controlling the level of the amplified electrical signals within the audio frequency range at the output terminal thereof and a loudspeaker operatively connected to the output terminal of the amplifier for converting the amplified electrical signals within the audio frequency range into output sound waves which are amplified facsimiles of the input sound waves and which are radiated, via the detachable ear-canal shell, into the ear-canal of a wearer, the standard hearing aid being modified to improve the reception of input modulated electromagnetic waves within a predetermined microwave frequency range and eliminating the reception of the input sound waves to produce a self-contained personal microwave detector, wherein the modification comprises:

disconnecting the output terminal of the microphone from the input terminal of the amplifier; and connecting a wire to the input terminal of the amplifier and through and outside of the housing such that when the input modulated electromagnetic waves within the predetermined microwave frequency range are received, an audible signal is produced whose level and frequency is related to the modulation of the input modulated electromagnetic waves within the predetermined microwave frequency range thereby warning a wearer of the self-contained personal microwave detector of the presence of input modulated electromagnetic waves within the predetermined microwave frequency range whose levels are dangerously high.

2. The self-contained personal microwave detector of claim 1 further comprising a plastic sleeve operatively attached to the housing and the wire to provide strain relief to the wire.

3. The self-contained personal microwave detector of claim 2 wherein the wire is an insulated copper wire 5 cm in length.

4. The self-contained personal microwave detector of claim 3 wherein the predetermined microwave frequency range is 2 MHz to 3 GHz.

5. In a standard hearing aid configured to normally convert input sound waves into electrical signals and, in turn, into amplified electrical signals within the audio frequency range, the standard hearing aid including a housing, a detachable ear-canal shell operatively attached to the housing, a microphone operatively attached to the housing and the detachable ear-canal shell for converting the input sound waves into the electrical signals within the audio frequency range at an output terminal of the microphone, an amplifier having an input terminal operatively connected to the output terminal of the microphone for increasing the level of the electrical signals within the audio frequency range at the output terminal of the microphone so as to produce at an output terminal of the amplifier amplified electrical signals within the audio frequency range, a battery operatively connected to the amplifier for supplying power thereto, a volume control operatively connected to the amplifier for controlling the level of the amplified electrical signals within the audio frequency range at the output terminal thereof and a loudspeaker operatively connected to the output terminal of the amplifier for converting the amplified electrical signals within the audio frequency range into output sound waves which are amplified facsimiles of the input sound waves and which are radiated, via the detachable ear-canal shell, into the ear-canal of a wearer, the standard hearing aid being modified to improve the reception of input modulated electromagnetic waves within a predetermined microwave frequency range and eliminating the reception of the input sound waves to produce a self-contained personal microwave detector, wherein the modification comprises:

removing the microphone from the housing;

connecting an output terminal of a detector diode to the input terminal of the amplifier;

connecting an output terminal of a miniature microwave amplifier to an input terminal of the detector diode; and connecting a wire to an input terminal of the miniature microwave amplifier and through and outside of the housing so as to improve the reception of the input modulated electromagnetic waves within the predetermined microwave frequency range, and such that when the input modulated electromagnetic waves within the predetermined microwave frequency range are received, an audible signal is produced whose level and frequency is related to the modulation of the input modulated electromagnetic waves within the predetermined microwave frequency range thereby warning a wearer of the self-contained personal microwave detector of the presence of input modulated electromagnetic waves within the predetermined microwave frequency range whose levels are dangerously high.

6. The self-contained personal microwave detector of claim 5 further comprising a plastic sleeve operatively attached to the housing and the wire to provide strain relief to the wire.

7. The self-contained personal microwave detector of claim 6 wherein the wire is an insulated copper wire 7 cm in length.

8. The self-contained personal microwave detector of claim 7 wherein the predetermined microwave frequency range is 3 GHz to 22 GHz.

* * * * *